(12) United States Patent
Qiao et al.

(10) Patent No.: US 6,373,679 B1
(45) Date of Patent: Apr. 16, 2002

(54) ELECTROSTATIC OR MECHANICAL CHUCK ASSEMBLY CONFERRING IMPROVED TEMPERATURE UNIFORMITY ONTO WORKPIECES HELD THEREBY, WORKPIECE PROCESSING TECHNOLOGY AND/OR APPARATUS CONTAINING THE SAME, AND METHOD(S) FOR HOLDING AND/OR PROCESSING A WORKPIECE WITH THE SAME

(75) Inventors: Jianmin Qiao, Fremont; James E. Nulty, San Jose; Paul Arleo, San Francisco; Siamak Salimian, Sunnyvale, all of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/347,437

(22) Filed: Jul. 2, 1999

(51) Int. Cl.⁷ ............................................... H02N 13/00
(52) U.S. Cl. ...................................... 361/230; 361/233
(58) Field of Search ................................. 361/230, 233, 361/234, 145; 279/128; 216/67; 156/345; 118/723, 728

(56) References Cited

U.S. PATENT DOCUMENTS

| | | |
|---|---|---|
| 4,771,730 A | 9/1988 | Tezuka |
| 4,971,653 A | 11/1990 | Powell et al. |
| 5,078,851 A | 1/1992 | Nishihats et al. |
| 5,096,536 A | 3/1992 | Cathey, Jr. |
| 5,248,370 A | 9/1993 | Tsui et al. |
| 5,290,381 A | 3/1994 | Nozawa et al. |
| 5,320,982 A | 6/1994 | Tsubone et al. |
| 5,350,479 A | 9/1994 | Collins et al. |
| 5,382,311 A | 1/1995 | Ishikawa et al. |
| 5,458,687 A | 10/1995 | Shichida et al. |
| 5,530,616 A | 6/1996 | Kitabayashi et al. |
| 5,539,609 A | 7/1996 | Collins et al. |
| 5,542,559 A | 8/1996 | Kawakami et al. |
| 5,548,470 A | 8/1996 | Husain et al. |
| 5,556,500 A | 9/1996 | Hasegawa et al. |
| 5,595,241 A | 1/1997 | Jelinek |
| 5,609,720 A | 3/1997 | Lenz et al. |
| 5,631,803 A | 5/1997 | Cameron et al. |
| 5,671,117 A | 9/1997 | Sherstinsky et al. |
| 5,673,167 A | 9/1997 | Davenport et al. |
| 5,673,750 A | 10/1997 | Tsubone et al. |
| 5,675,471 A | 10/1997 | Kotecki |
| 5,708,556 A | 1/1998 | van Os et al. |
| 5,715,132 A | 2/1998 | Steger et al. |
| 5,730,803 A * | 3/1998 | Steger et al. ........... 118/723 R |
| 5,761,023 A | 6/1998 | Lue et al. |

FOREIGN PATENT DOCUMENTS

JP   63078975   3/1998

OTHER PUBLICATIONS

Applied Materials News Room; "Applied Materials Introduces Electrostatic Chuck for HP PVD Family of Products"; Santa Clara, CA; Jun. 12, 1996; 2 pages.

(List continued on next page.)

Primary Examiner—Josie Ballato
Assistant Examiner—Robert L. Deberadinis
(74) Attorney, Agent, or Firm—Christopher P. Maiorana, P.C.

(57) ABSTRACT

An electrostatic or mechanical chuck assembly includes gas inlets only in an annulus-shaped peripheral portion and not in the central region of the chuck. The gas inlets are in fluid communication with one or more gas conduits and supply of the backside of a workpiece, such as a semiconductor wafer, with inert coolant gas or gases. The gas or gases supplied only to the peripheral region of the chuck effectively cool the central region of the chuck by at least two physical mechanisms, including the thermal conduction through the workpiece and diffusion of the gas or gases in the interstitial space(s) between the somewhat irregular facing surfaces of the chuck and of the backside of the workpiece.

20 Claims, 5 Drawing Sheets

OTHER PUBLICATIONS

Applied Materials News Room; "Applied MaterialsRanked Number One Etch Supplier"; Santa Clara, CA; Sep. 24, 1998; 2 pages.

Applied Materials News Room; "Applied Materials Ships 1,000th Dielectric Etch MXP+ Process Chamber"; Santa Clara, CA; May 1, 1998; 2 pages.

Applied Materials News Room; "Applied Materials Introduces High Productivity Silicon Etch System"; Santa Clara, CA; Nov. 14, 1996; 2 pages.

Applied Materials News Room; "Applied Materials Introduces New Dielectric Etch System"; Santa Clara, CA; Mar. 17, 1997; 2 pages.

Applied Materials News Room; "Applied Materials Announces Next–Generation CVD Gap–Fill Technology"; Santa Clara, CA; Feb. 14, 1996; 2 pages.

Applied Materials News Room; "Additional Technical Information"; 2 pages.

Applied Materials Products and Services; Etch Product Business Group; 3 pages.

* cited by examiner

ELECTROSTATIC OR MECHANICAL CHUCK ASSEMBLY CONFERRING IMPROVED TEMPERATURE UNIFORMITY ONTO WORKPIECES HELD THEREBY, WORKPIECE PROCESSING TECHNOLOGY AND/OR APPARATUS CONTAINING THE SAME, AND METHOD(S) FOR HOLDING AND/OR PROCESSING A WORKPIECE WITH THE SAME

BACKGROUND OF THE INVENTION

1. Field of the Invention

The present invention pertains to the field of electrostatic and mechanical chucks for semiconductor process chambers. More particularly, the present invention pertains to an apparatus, technology and method(s) for increasing temperature uniformity of workpieces, such as semiconductor wafers, during processing steps, such as plasma etching steps.

2. Description of the Related Art

The processing of semiconductor wafers in process chambers may require that the wafer be supported by a pedestal, which is commonly known as a chuck. Chucks may be either mechanical or electrostatic. Mechanical chucks include one or more clamps to secure the wafer to a support. Electrostatic chucks rely on the electrostatic pressure generated by an electrode energized by a DC voltage source to secure the wafer to the chuck.

Different processing steps typically require different processing temperatures. One commonly used method of varying the wafer temperature is by varying the temperature of the wafer backside, the side of the wafer in contact with the mechanical or electrostatic chuck. An inert gas or a combination of inert gases, such as helium, nitrogen or argon, for example, is often used to regulate the backside temperature of the wafer. This inert gas is directed toward the wafer backside at a predetermined temperature and pressure. When electrostatic chucks are used, however, it has been found that at a given inert gas pressure, the temperature of the wafer may be different toward the center than toward the peripheral area of the wafer. For example, the temperature toward the center of the wafer may be lower than the temperature toward the peripheral edge of the wafer, for a given inert gas pressure. This temperature differential between central and peripheral areas of the wafer is generally undesirable, as it may directly and adversely affect the effectiveness of the processing steps during the formation of the integrated circuits on the wafer.

Highly selective etch processes, for example, require a high degree of selectivity uniformity. Selectivity uniformity, in terms of highly selective etch process technology, refers to the ability of an etch step to etch only that portion of the device (e.g., transistor) necessary to form the desired structure (such as a trench), and to do so in a uniform manner for all such devices across the width of the wafer. Selectivity uniformity may also be defined as the selectivity across the wafer (maximum delta number) divided by the average selectivity. For example, it may be desired to etch a trench between adjacent 1T transistors, which trench is to be filed with a conductive (tungsten, for example) plug to form an electrical interconnect with the underlying substrate. If there is poor selectivity uniformity, a same etch step may produce different results near the center of the wafer than it does near the periphery of the wafer. For example, if the temperature at or near the edge of the wafer is greater than the temperature at or near the periphery of the wafer (or if the magnitude of the temperature differential between the center and the periphery of the wafer is impermissibly large), a same etch step may provide good corner protection near the periphery and poor corner protection near the center of the wafer. Indeed, such an etch step may properly etch the layer between the gate structures (e.g. PSG or BPSG, for example) without etching the layer (e.g. silicon nitride, for example) covering the underlying gate (e.g. a polysilicon gate layer, for example) structure near the periphery while unacceptably etching a portion of the silicon nitride near the center of the device, a phenomena sometimes called "punch through". "Punch through" can damage the underlying gate structure and thus adversely affect both product quality of the resultant devices and the yield of the process.

It is thus desirable to control the temperature of the wafer so as to improve the temperature uniformity across the width of the wafer. Moreover, it is desirable to improve the selectivity uniformity of etch steps in semiconductor process chambers. Attempts to address the issue of temperature uniformity across the width of silicon wafers have thus far centered upon a complex system of seals, chuck topographic features and/or multiple supplies of coolant gasses at varying temperatures and pressures. However, such systems may require complete redesigns of existing process chambers and/or gas supply mechanisms. Such re-designs may, in many situations, prove to be prohibitively costly. Indeed, as the marketplace for semiconductors sometimes resembles a commodity market, such costly re-designs may negatively affect the semiconductor manufacturer's ability to bring competitively-priced products to market, notwithstanding any marginal increase in yield such systems may provide.

SUMMARY OF THE INVENTION

An object of the present invention, therefore, is to provide improved temperature uniformity across the width of workpieces (such as, for example, silicon wafers) held by an electrostatic or mechanical chuck. Another object of the present invention is to improve the selectivity uniformity of etch steps in semiconductor process chambers. It is a further object of the invention to provide an electrostatic or a mechanical chuck assembly that exhibits improved temperature uniformity characteristics and that does not require extensive and/or costly modifications to existing processing chambers and/or gas supply mechanisms.

In accordance with the above-described objects and those that will be mentioned and will become apparent below, an electrostatic chuck assembly, according to an embodiment of the present invention, comprises:

a first dielectric layer including a first and a second surface;

a first electrode in contact with the first surface;

at least one gas conduit;

a second electrode in contact with the second surface, the second electrode including:

a circumference defined by a first radius, a central region; and an annular peripheral region concentric with the central region and bounded by the circumference and an inner boundary defined by a second radius, the second radius being no less than about 60% of the first radius. A plurality of gas inlets are defined only in the peripheral region, each of the plurality of gas inlets being in fluid communication with the at least one gas conduit.

According to further embodiments, a second dielectric layer may be disposed on the second electrode in such a manner as to allow free passage of gas through each of the plurality of gas inlets. The second dielectric layer may include a polyimide and/or a ceramic material. The surface of at least the central region is preferably sufficiently irregular to allow diffusion of gas from the peripheral region to within the central region when a workpiece is disposed on the chuck.

The present invention may also be viewed as a method for cooling a workpiece in a processing chamber, comprising the steps of:

supporting the workpiece on a substantially planar surface, the surface having a first radius defining a circumference thereof, a central region and an annular peripheral region concentric with the central region and bounded by the circumference and a second radius, the second radius being no less than about 60% of the first radius, the peripheral region only defining a plurality of gas inlets; and delivering gas directly only to the peripheral region, through at least one gas conduit in fluid communication with the plurality of gas inlets.

According to further embodiments, the delivering step may deliver the gas or gasses at a pressure effective to cool both the central and peripheral regions of the workpiece to within a temperature differential consistent with further processing of the workpiece. The temperature differential may be less than about 15° C. The delivering step may deliver the gas or gasses at a pressure effective to cause diffusion of gas from the plurality of gas inlets to the central region, via one or more interstitial spaces between the substantially planar surface and the workpiece supported thereby. The substantially planar surface may be a top-most surface of an electrostatic chuck, in which case the top-most surface may be adapted to contact a backside of a semiconductor wafer held by the electrostatic chuck. The substantially planar surface may be a top-most surface of a mechanical chuck, in which case the top-most surface may be adapted to contact a backside of a semiconductor wafer held by the mechanical chuck.

The present invention, according to a still further embodiment, may be viewed as an apparatus for processing a semiconductor wafer, comprising:

a process chamber;

an RF source;

a gas introduction port for introducing a process gas into the process chamber;

a gas evacuation port for evacuating the process gas from the process chamber;

a chuck assembly for holding and supporting the semiconductor wafer within the process chamber, the chuck assembly including:

a first dielectric layer including a first and a second surface;

a first electrode in contact with the first surface;

at least one gas conduit;

a second electrode in contact with the second surface, the second electrode including:

a circumference defined by a first radius, a central region; and an annular peripheral region concentric with the central region and bounded by the circumference and an inner boundary defined by a second radius, the second radius being no less than about 60% of the first radius. A plurality of gas inlets are preferably defined only in the peripheral region, each of the plurality of gas inlets being in fluid communication with the at least one gas conduit.

A second dielectric layer may be disposed on the second electrode in such a manner as to allow free passage of gas through each of the plurality of gas inlets. The second dielectric layer may include polyimide and/or a ceramic material. The surface of at least the central region is preferably sufficiently irregular to allow diffusion of gas from the peripheral region to within the central region when a workpiece is disposed on the chuck.

The foregoing and other features of the invention are described in detail below and set forth in the appended claims.

BRIEF DESCRIPTION OF THE DRAWINGS

For a further understanding of the objects and advantages of the present invention, reference should be made to the following detailed description, taken in conjunction with the accompanying figures, in which:

FIG. 1b is a detail view of a portion of the electrostatic chuck assembly 150 depicted in FIG. 1a.

DESCRIPTION OF THE PREFERRED EMBODIMENTS

Figure 1A:
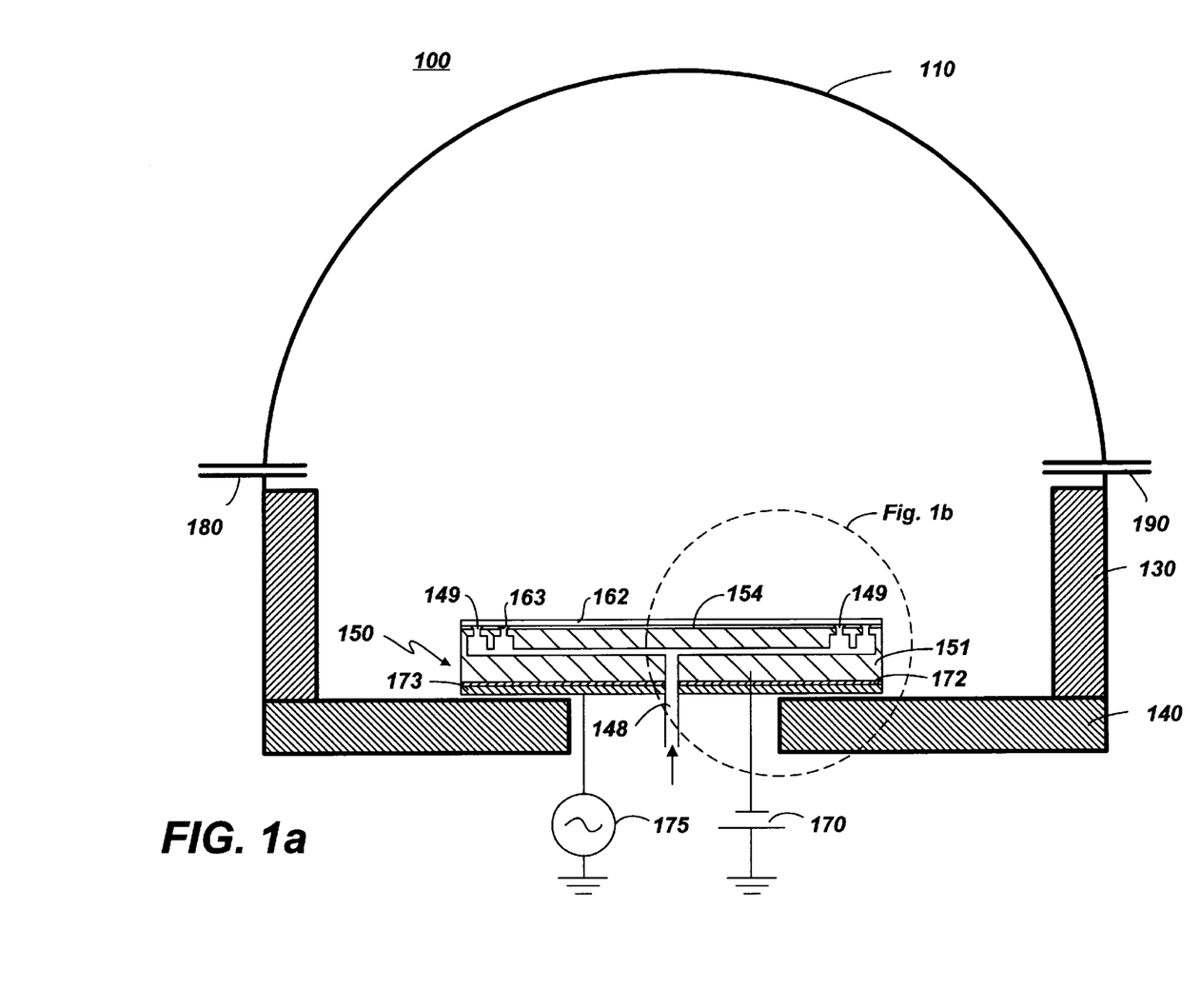
FIG. 1a schematically illustrates a process chamber 100 including an electrostatic chuck assembly 150, according to an embodiment of the present invention.

FIG. 1a schematically illustrates a process chamber 100 including an electrostatic chuck assembly 150, according to an embodiment of the present invention. The process chamber 100 shown in FIG. 1a includes an electrostatic chuck assembly 150, a chamber sidewall 130, a chamber base 140, a chamber ceiling 110, a gas introduction port 180 to introduce process gases (such as etching and/or carrier gases) into the process chamber 100 and a gas evacuation port 190 to evacuate the process gases from the process chamber 100. It should be understood, however, that the present invention is not limited to inductively coupled process chambers. For example, the present invention is equally applicable to capacitively coupled process chambers. The electrostatic chuck assembly 150 includes, according to an embodiment of the present invention, a DC electrode 151 coupled to a DC bias source 170, a first dielectric layer 172, an RF electrode 173 coupled to an RF power source 175 and a second dielectric layer 154 forming an electrostatic chuck seal. In operation, the workpiece or wafer 162 to be processed is supported by the electrostatic chuck assembly 150 and in contact with the second dielectric layer 154. The electrostatic chuck assembly 150 also includes a plurality of coolant gas inlets 149. Each of the coolant gas inlets 149 may be supplied with inert gas(es), such as, for example, nitrogen, helium or argon via gas conduit(s) 148. Conduit(s) 148 may be connected to conventional gas pressure sensors and controllable valves (not shown) that sense and regulate, respectively, the pressure(s) of the inert gas(es) supplied via the gas conduit(s) 148. The coolant gas inlets 149 face (open to) the backside 163 of the workpiece or wafer 162 to improve the heat exchange between the chuck assembly 150 and the wafer backside 163 and to cool the workpiece or wafer 162. The chuck assembly 150 may also be cooled by means of water and/or other coolants.

The second dielectric layer or chuck seal 154 may be integral to the electrostatic chuck assembly 150 or may be separate therefrom, and may be made of a dielectric material such as, for example, polyimide or a ceramic. The chuck seal 154 should preferably be a DC insulator and be transparent to the applied RF bias. If the chuck assembly 150 is a mechanical chuck, the seal 154 may be made or formed of one or more conducting materials. In the case of an electrostatic chuck, the workpiece, such as semiconductor wafer 162, rests on the chuck seal 154 and is maintained securely thereon by the electrostatic attraction created by the DC bias applied by DC bias source 170. FIG. 1a, as those of skill will recognize, omits unnecessary and obscuring details and only shows those structures necessary for a complete representation and understanding of the chuck assembly 150 according to the present invention.

Figure 4:
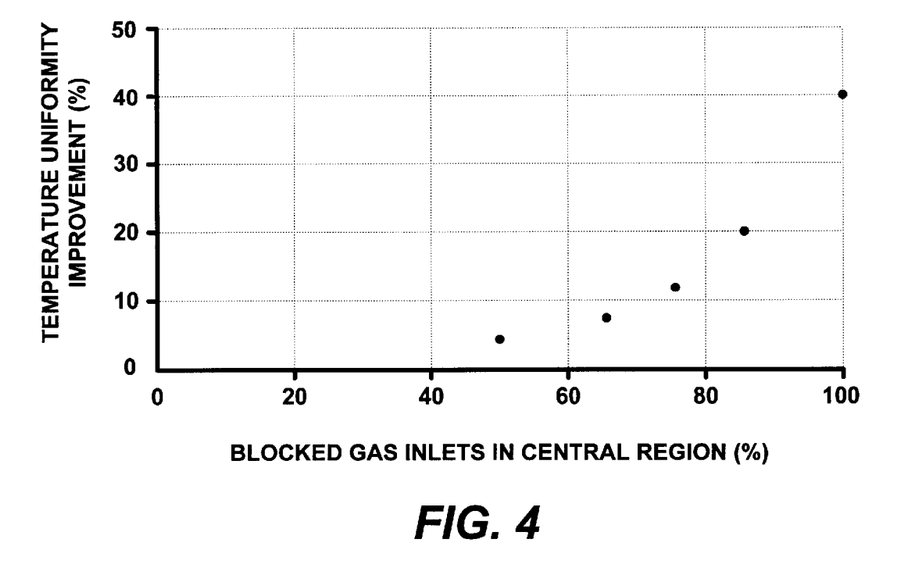
FIG. 4 is a graph depicting the percentage of improvement in the temperature uniformity across a workpiece relative to the number of blocked gas inlets in the central region of the workpiece.
Figure 5:
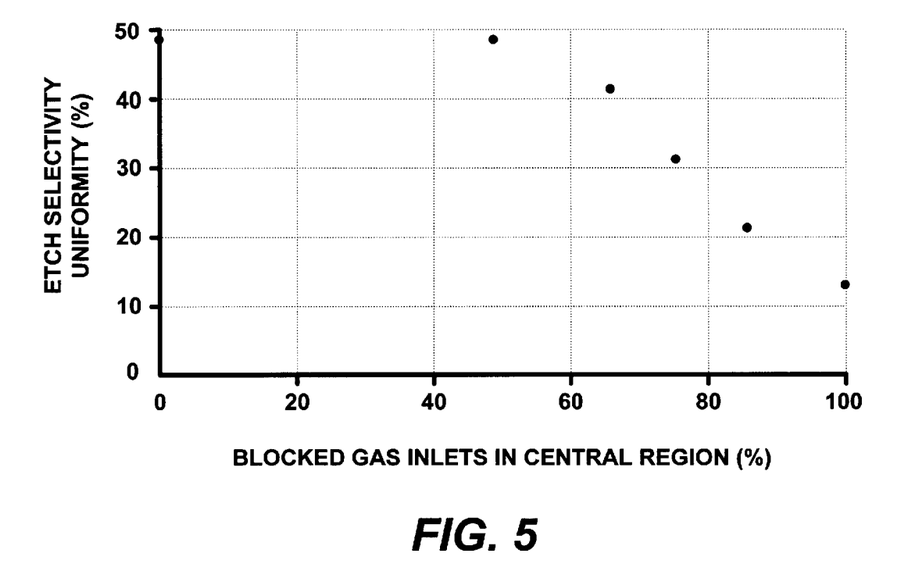
FIG. 5 is a graph relating etch selectivity percentage across a workpiece to the number of blocked gas inlets in the central region of the workpiece.

According to the present invention, coolant gas inlets 149 are provided only near the circumference of the chuck assembly 150, and not toward the center portion thereof. Indeed, it has been found that greater temperature uniformity may be achieved, according to the present invention, if the coolant gas inlets 149 in the central portion of the chuck (e.g., the coolant gas inlets toward the center of the chuck) are plugged (i.e., closed off) in a gas-tight manner or eliminated altogether. This is shown in the graph shown at FIG. 4, which relates the percentage of blocked gas inlets in the central region of the chuck to the percentage improvement in the temperature uniformity across a semiconductor wafer 162, assuming an initial generally uniform gas inlet distribution across the width of the wafer 162. As shown in FIG. 4, temperature uniformity begins to increase when about half of the gas inlets in the central region of the workpiece are blocked. When all or substantially all of the gas inlets in the central region are blocked, a marked improvement of about 40% in temperature uniformity was observed in the trial shown in FIG. 4. FIG. 5 is a graph relating etch selectivity percentage across a workpiece to the number of blocked gas inlets in the central region of the workpiece, again assuming an initial generally uniform gas inlet distribution across the width of the wafer 162. In the trial shown in FIG. 5, the selectivity uniformity percentage begins to decrease when more than about half of the gas inlets in the central region of the workpiece are blocked. When all or substantially all of the gas inlets in the central region are blocked, the selectivity uniformity percentage drops to about 15% from slightly less than about 50% when less than half of the existing gas inlets are blocked. As the selectivity uniformity percentage may be defined as selectivity range across the workpiece or wafer (maximum delta number) divided by the average selectivity, small selectivity percentages translate into high degrees of uniformity.

According to the present invention, therefore, coolant gas(es) is/are directly provided only to a peripheral (circumferential) portion of the backside 163 of the wafer 162. In so doing, the peripheral portion of the backside 163 of the workpiece 162 (shaped as an annulus whose outermost edge is disposed near the circumference of the workpiece) is cooled to a relatively greater degree than the center portion thereof. To do so, according to an embodiment of the present invention, coolant gas(ses) inlets 149 are only defined (e.g., formed, for example) within a peripheral portion of the chuck assembly 150, which gas inlets 149 are aligned with the corresponding peripheral portion of the backside 163 of the workpiece 162. Directing coolant gas (ses) only to the peripheral portion of the backside 163 of the workpiece 162 compensates for the natural tendency of the center of the workpiece 162 to cool to a greater degree than the peripheral portion thereof in the process (etch, for example) chamber 100, and allows for a smaller temperature differential across the width of the workpiece 162. A smaller temperature gradient across the width of the workpiece 162, in turn, allows for greater selectivity uniformity in the etch steps, among other benefits.

Figure 1B:
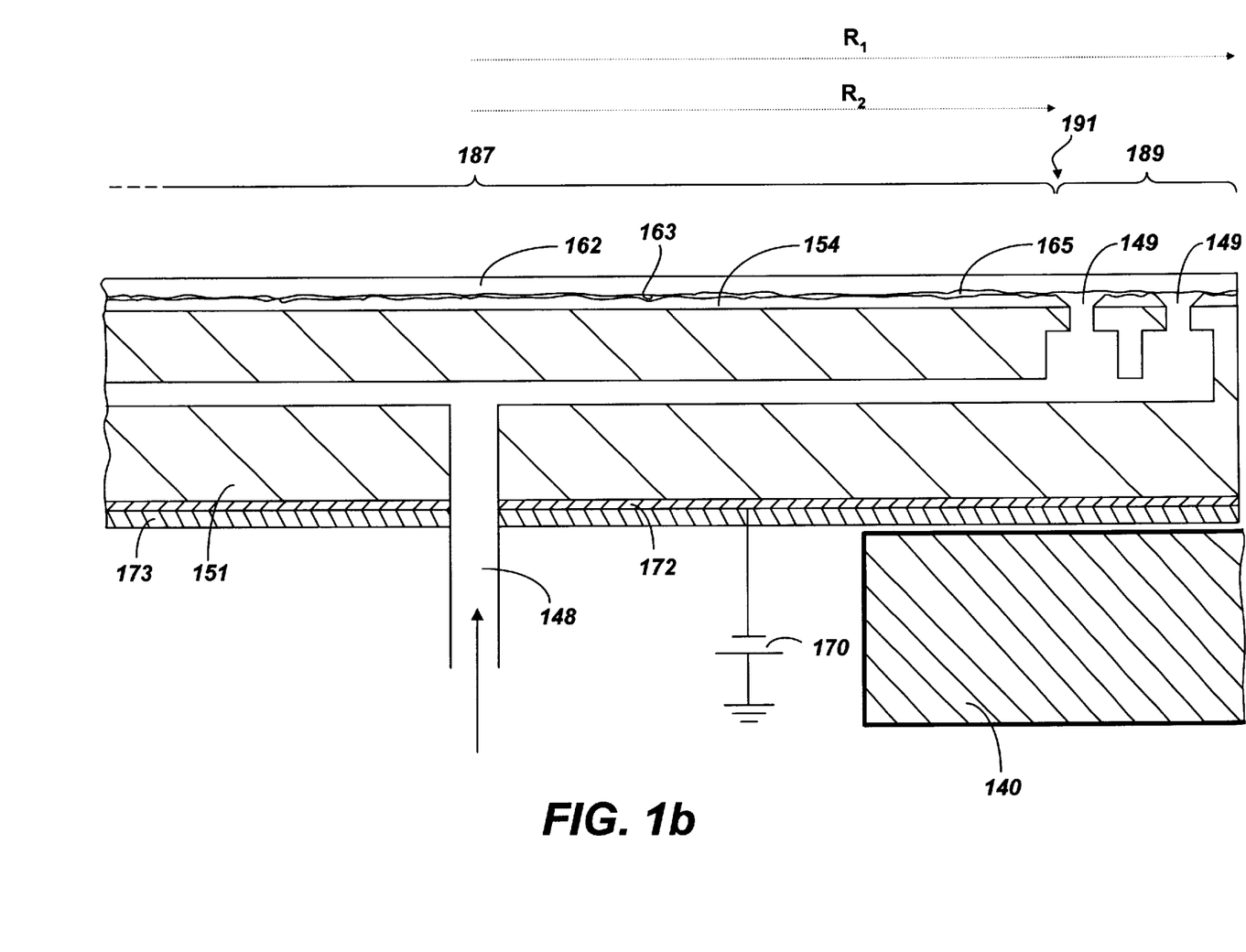

FIG. 1b is an enlarged view of a portion of the process chamber 100 shown in FIG. 1a, and illustrates a number of features of the present invention. As shown therein, the gas conduit(s) 148 within the DC electrode 151 supplies coolant gas(ses) to the backside 163 of the workpiece 162 via the coolant gas(ses) inlets 149. The chuck seal 154 may include, for example, a layer of polyimide deposited on the topmost surface (the surface closest to and facing the workpiece 162). As most clearly seen in FIG. 1b, the chuck seal 154 does not obstruct the coolant gas inlets 149 and allow the coolant gas to directly impinge upon the workpiece backside 163. According to the present invention, the coolant gas inlets 149 are disposed only in the peripheral region 189 of the chuck assembly 150 and not in the central region 187 thereof. According to the present invention, the peripheral region 189 may include an annular- (washer-) shaped region that is concentric with the central region 187 and that is bounded by the circumference of the chuck assembly 150 defined by a first radius $R_1$ and an inner boundary 191 defined by a second radius $R_2$ (both radii also being clearly shown in FIGS. 2 and 3), the second radius $R_2$ being no less than about 60% of the first radius $R_1$.

Preferably, the radial width of the peripheral region 189 may be defined between about 2% and 25% of the first radius $R_1$ of the chuck assembly 150. More preferably still, the radial width of the peripheral region 189 may be defined between about 6% and 16% of the first radius $R_1$ of the chuck assembly 150. For example, in one representative embodiment, the radial width of the peripheral region 189 is selected to be about 13% of the radius $R_1$ of the chuck assembly 150, or about 10 millimeters for a silicon wafer about 75 millimeters in radius (about 6 inches in diameter).

The aggregate area of the workpiece backside 163 that is in direct contact with the coolant gas (ses) through the gas inlets 149 may be very small, as each of the gas inlets 149 (each having a diameter, for example of only about 30 mils) may be thought of as providing only a point contact with the coolant gas(ses). Therefore, the coolant gas(ses) impinge directly on only the small areas of the backside 163 of the workpiece 162 that are aligned with the gas inlets 149. However, it has been found that the central region 187 of the workpiece is nevertheless sufficiently cooled to allow an improved thermal uniformity across the width of the workpiece 162. This cooling of the central region 187 is believed to occur by at least two physical mechanisms. For example, in the case wherein the workpiece 162 includes a silicon wafer, the thermal conductivity of the silicon contributes to the cooling of the central region 187. Moreover, as shown in FIG. 1b, neither the backside 163 of the workpiece 162 nor the surface of the chuck seal 154 in contact with the backside 163 is perfectly smooth. Indeed, both the backside 163 and the surface of the chuck seal 154 in contact therewith are inherently somewhat non-planar, and include microscopic surface irregularities. Although these surface irregularities are small and do not affect the functionality of the resultant device(s), they are believed to be sufficient to allow an effective amount of coolant gas(ses) to diffuse into the central portion 187 of the workpiece via interstitial space(s) 165 between the substantially planar surface of the chuck assembly 150 and the backside 163 of the workpiece supported thereby. According to the present invention, the pressure(s) at which the coolant gas(ses) may be delivered to the backside 163 of the workpiece 162 through the gas inlets 149 may be set to a level or levels effective to cause diffusion of the coolant gas(ses) from the gas inlets 149 to the central region 187 of the workpiece 162. Generally such pressure is higher than the pressure at which coolant gas(ses) would be delivered to a chuck assembly 150 that includes gas inlets in the central portion 187, in contradistinction to the structure of the chuck assembly 150 of the present invention. Indeed, an increased coolant gas pressure may be necessary to cause a sufficient (i.e., an amount effective for the current process) amount of coolant gas to diffuse from the peripherally located gas inlets 149 to the central region 187 via the interstitial space(s) 165 between the chuck assembly 150 and the backside 163 of the workpiece 162.

Figure 2:
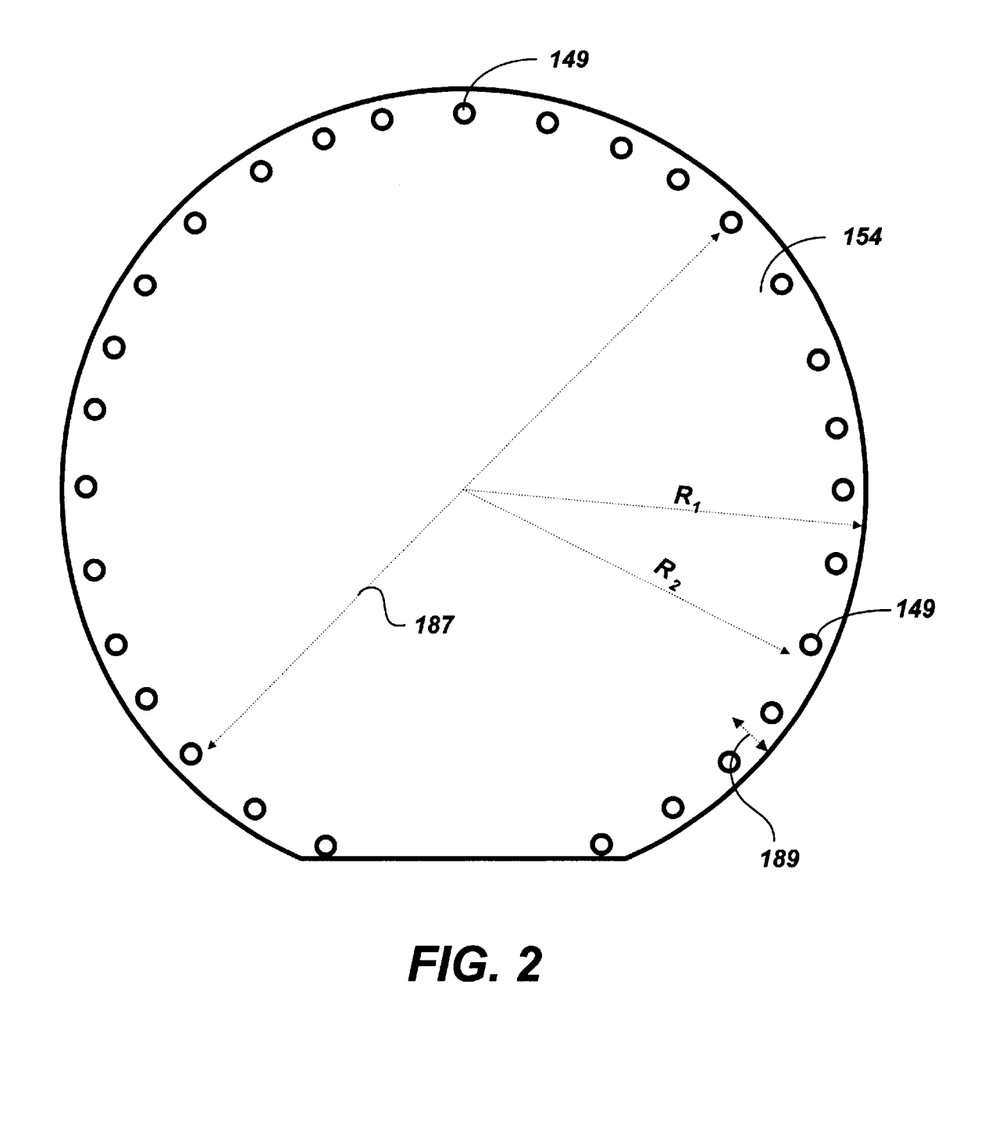
FIG. 2 is a plan view of the electrostatic chuck assembly 150, showing a distribution of coolant gas inlets according to an embodiment of the present invention.
Figure 3:
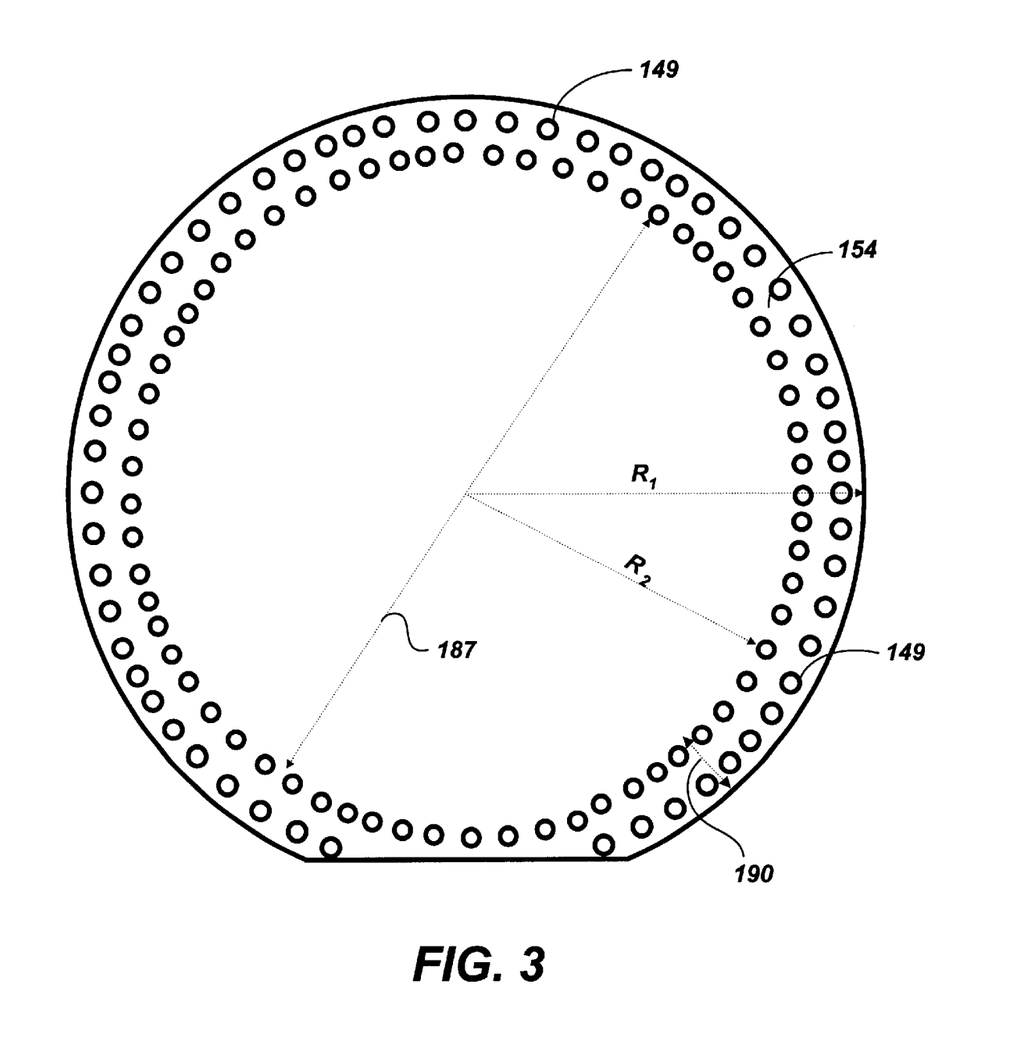
FIG. 3 is a plan view of the electrostatic chuck assembly 150, showing another distribution of coolant gas inlets, according to another embodiment of the present invention.

FIG. 2 is a plan view of the electrostatic chuck assembly 150, showing one of many possible distributions of coolant gas inlets 149 according to an embodiment of the present invention. FIG. 3 is also a plan view of the electrostatic chuck assembly 150, showing another distribution of coolant gas inlets 149, according to another embodiment of the present invention. Like structures, regions and radii are referred to by the same numerals and legends as the corresponding structures in FIGS. 1a and 1b. As shown in FIGS. 2 and 3, the peripheral region 189, 190 may be shaped as a thin annulus (washer) concentric with the central region 187 thereof and disposed near the outer circumference of the chuck assembly 150. The peripheral region only, according to the present invention, comprises a plurality of gas inlets 149, such as the single row of gas inlets 149 in the peripheral region 189 of FIG. 2 and the double row of gas inlets 149 in the peripheral region 190 of FIG. 3. As shown in FIG. 3, the peripheral region 190 may be wider than the peripheral region 189 shown in FIG. 2 and may define, for example, two or more rows of gas inlets 149. Other spatial distributions of the gas inlets 149 in the peripheral regions 189, 190 are possible, as are other widths of the peripheral regions 189, 190, as specifically disclosed relative to FIG. 1b. As those of skill will recognize, FIGS. 1a, 1b, 2 and 3 omit certain known details for clarity of illustration. Such omitted, but well known features include, for example, the lift pins that lift the workpiece 162 onto and off the chuck assembly 150 during processing.

While the foregoing detailed description has described preferred embodiments of the present invention, it is to be understood that the above description is illustrative only and not limiting of the disclosed invention. For example, the number, shape and distribution of the gas inlets 149 may differ from that described and illustrated herein. Still other modifications may occur to those of skill in this art. Thus, the present invention to be limited only by the claims as set forth below.

What is claimed is:

1. An electrostatic chuck assembly, comprising:
   a first dielectric layer including a first and a second surface;
   a first electrode in contact with the first surface;
   at least one gas conduit;
   a second electrode in contact with the second surface, the second electrode including:
      a circumference defined by a first radius,
      a central region; and
      an annular peripheral region concentric with the central region and bounded by the circumference and an inner boundary defined by a second radius, the second radius being no less than about 60% of the first radius,
      wherein a plurality of gas inlets are defined only in the peripheral region, each of the plurality of gas inlets being in fluid communication with the at least one gas conduit to deliver gas directly only to the peripheral region at a pressure set to diffuse the gas to the central region.

2. The electrostatic chuck assembly of claim 1, further including a second dielectric layer disposed on the second electrode in such a manner as to allow free passage of gas through each of the plurality of gas inlets.

3. The electrostatic chuck assembly of claim 2, wherein the second dielectric layer includes one of a polyimide and a ceramic material.

4. The electrostatic chuck assembly of claim 1, wherein a surface of at least the central region is sufficiently irregular to allow diffusion of gas from the peripheral region to within the central region when a workpiece is disposed on the chuck.

5. The electrostatic chuck assembly of claim 4, wherein said surface comprises microscopic irregularities sufficient to diffuse said gas.

6. The electrostatic chuck assembly of claim 1, wherein said annular peripheral region has a radial width between 2% and 25% of said first radius.

7. The electrostatic chuck assembly of claim 1, wherein said annular peripheral region has a radial width between 6% and 16% of said first radius.

8. A method for cooling a workpiece in a processing chamber, comprising the steps of:
   supporting the workpiece on a substantially planar surface, the surface having a first radius defining a circumference thereof, a central region and an annular peripheral region concentric with the central region and bounded by the circumference and a second radius, the second radius being no less than about 60% of the first radius, the peripheral region only defining a plurality of gas inlets;
   delivering gas directly only to the peripheral region, through at least one gas conduit in fluid communication with the plurality of gas inlets; and
   setting a pressure of the gas to a level where the gas diffuses to the central region.

9. The method of claim 5, wherein the substantially planar surface is a top-most surface of an electrostatic chuck, the top-most surface being adapted to contact a backside of a semiconductor wafer held by the electrostatic chuck.

10. The method of claim 5, wherein the substantially planar surface is a top-most surface of a mechanical chuck, the top-most surface being adapted to contact a backside of a semiconductor wafer held by the mechanical chuck.

11. The method of claim 5, wherein the delivering step delivers said at least one gas at a pressure effective to cool both the central and peripheral regions of the workpiece to within a temperature differential consistent with further processing of the workpiece.

12. The method of claim 6, wherein the temperature differential is less than about 15° C.

13. The method of claim 5, wherein the delivering step delivers said at least one gas at a pressure effective to cause diffusion of gas from the plurality of gas inlets to the central region, via an interstitial space between the substantially planar surface and the workpiece supported thereby.

14. The method of claim 5, wherein said annular peripheral region has a radial width between 2% and 25% of said first radius.

15. Apparatus for processing a semiconductor wafer, comprising:

a process chamber;

an RF source;

a gas introduction port for introducing a process gas into the process chamber;

a gas evacuation port for evacuating the process gas from the process chamber;

a chuck assembly for holding and supporting the semiconductor wafer within the process chamber, the chuck assembly including:
  a first dielectric layer including a first and a second surface;
  a first electrode in contact with the first surface;
  at least one gas conduit;
  a second electrode in contact with the second surface, the second electrode including:
    a circumference defined by a first radius,
    a central region; and
    an annular peripheral region concentric with the central region and bounded by the circumference and an inner boundary defined by a second radius, the second radius being no less than about 60% of the first radius,
  wherein a plurality of gas inlets are defined only in the peripheral region, each of the plurality of gas inlets being in fluid communication with the at least one gas conduit to deliver gas directly only to the peripheral region at a pressure set to diffuse the gas to the central region.

16. The apparatus of claim 11, further including a second dielectric layer disposed on the second electrode in such a manner as to allow free passage of gas through each of the plurality of gas inlets.

17. The apparatus of claim 12, wherein the second dielectric layer includes one of a polyimide and a ceramic material.

18. The apparatus of claim 11, wherein said annular peripheral region has a radial width between 2% and 25% of said first radius.

19. The electrostatic chuck assembly of claim 11, wherein a surface of at least the central region is sufficiently irregular to allow diffusion of gas from the peripheral region to within the central region when a workpiece is disposed on the chuck.

20. The apparatus of claim 14, wherein said surface comprises microscopic irregularities sufficient to diffuse said gas.

* * * * *